(12) United States Patent
Tsuno et al.

(10) Patent No.: US 6,180,890 B1
(45) Date of Patent: Jan. 30, 2001

(54) COMPOSITE TYPE MAGNETIC HEAD USING COMPOSITE METALLIC WIRE

(75) Inventors: Nobuo Tsuno, Kasugai; Soichiro Matsuzawa, Kuwana, both of (JP)

(73) Assignee: NGK Insulators, Ltd., Nagoya (JP)

( * ) Notice: Under 35 U.S.C. 154(b), the term of this patent shall be extended for 0 days.

(21) Appl. No.: 09/548,336

(22) Filed: Apr. 12, 2000

Related U.S. Application Data

(62) Division of application No. 08/824,114, filed on Mar. 26, 1997, now Pat. No. 6,068,917.

(30) Foreign Application Priority Data

Mar. 29, 1996 (JP) ........................................ 8-75928
Mar. 12, 1997 (JP) ........................................ 9-57833

(51) Int. Cl.$^7$ .................................................. H01B 5/00
(52) U.S. Cl. ........................................ 174/126.2; 428/379
(58) Field of Search ........................... 174/126.1, 126.2, 174/126.4, 110 R; 428/379, 380, 381, 383, 385, 388, 592, 607, 389, 621, 626, 670, 675

(56) References Cited

U.S. PATENT DOCUMENTS

| 2,947,069 | 8/1960 | Carlson et al. ........................ 29/197 |
| 2,979,424 | 4/1961 | Whitehurst et al. ................. 117/227 |
| 3,397,046 | 8/1968 | Greyson ................................ 29/195 |
| 3,432,278 | 3/1969 | Richards ............................. 29/183.5 |
| 3,531,783 | 9/1970 | Doyle et al. ......................... 340/174 |
| 3,627,561 | 12/1971 | Richards ................................ 117/71 |
| 3,727,303 | 4/1973 | Brock et al. .......................... 29/603 |
| 5,364,706 | 11/1994 | Toyofuku et al. ................... 428/607 |
| 5,629,821 | 5/1997 | Wakasugi et al. ................... 360/125 |
| 5,796,044 | 8/1998 | Cobian et al. ....................... 174/103 |
| 5,871,530 | 2/1999 | Williams et al. ..................... 607/119 |

FOREIGN PATENT DOCUMENTS

| 1061202 | 12/1963 | (GB) . |
| J6-0026-037 | 2/1985 | (JP) . |
| J6-2097-360 | 5/1987 | (JP) . |
| 63-145794 | 6/1988 | (JP) . |
| 3-59775 B2 | 9/1991 | (JP) . |
| 7-49626 B2 | 5/1995 | (JP) . |

Primary Examiner—Kristine Kincaid
Assistant Examiner—Chau N. Nguyen
(74) Attorney, Agent, or Firm—Kubovcik & Kubovcik

(57) ABSTRACT

A composite metallic wire includes: an inner layer having a cross-sectional shape of a rough circle; and a metal outer layer having a cross-sectional shape of a rough ring; wherein the composite metallic wire has a diameter of 15 $\mu$m or less and an electric resistance of 300 $\Omega$/m or less. A composite type magnetic head using as a coil wire a composite wire comprising: (1) a composite metallic wire comprising: an inner layer having a cross-sectional shape of a rough circle; and a metal outer layer having a cross-sectional shape of a rough ring; wherein the composite metallic wire has a diameter of 15 $\mu$m or less and an electric resistance of 300 $\Omega$/m or less, and (2) an insulating coat provided in the outer periphery of the outer layer.

5 Claims, 2 Drawing Sheets

COMPOSITE TYPE MAGNETIC HEAD USING COMPOSITE METALLIC WIRE

This application is a division of application Ser. No. 08/824,114, filed Mar. 26, 1997 now U.S. Pat. No. 6,068,917.

BACKGROUND OF THE INVENTION AND RELATED ART STATEMENT

The present invention relates to a composite metallic wire which can be suitably used as a coil wire for a composite type magnetic head, particularly, as a coil wire for a high-density magnetic recording head and to a magnetic head using the composite metal wire.

With the spread of computers, an increase of a capacity and a speed up of a magnetic recording apparatus have been rapidly improving. Accordingly, a magnetic head is required to have (1) a smaller size and (2) a lower inductance.

In order to enlarge a valid recording area and improve a running followability of a magnetic recording apparatus, a slider is changed from one having dimensions of 4.3 mm×2.9 mm×0.86 mm, which was a standard slider originally, to another one having dimensions of 2.0 mm×1.6 mm×0.46 mm, which is a main current slider and called "50% slider". Further, a slider called "30% slider" is under investigation.

In order to improve a transmitting speed, it is required that a frequency upon reproducing a record. Therefore, it is required that an inductance of a magnetic head is lowered so as to shorten a rise time of a recording current in a range of high frequencies. For example, in the case of 600 Mb/in$^2$, the inductance is required to be 0.9 $\mu$H or less. In the case of 700 Mb/in$^2$, the inductance is required to be 0.7 $\mu$H or less. For reducing an inductance of a magnetic head, it is required that a cross sectional area of a magnetic path is reduced, for example, a thickness of a magnetic core is reduced, thereby causing a problem of reducing an efficiency of the head. To solve the problem, a magnetic path should be shortened. Specifically, a window for a coil should be made smaller, thereby reducing an inductance.

However, a window for a coil of a magnetic core is required to be wound by a coil wire with a predetermined number of turns. For example, in the case of 600 Mb/in$^2$, the number is 26, and in the case of 700 Mb/in$^2$, the number is 24. Therefore, the window is required to have a size sufficient for the winding. Accordingly, a minimum size of the window for a coil depends on a diameter of a wire used for the coil.

FIG. 3 shows a core chip in which a conventional wire is used. The core chip 10 mainly consisting of a trailing core 16 and leading core 18. A coil 28 made of a wire is wound around a window 12 for a coil formed by the trailing core 16 and a leading core 18.

The surfaces of the trailing core 16 and the leading core 18 which are facing to each other are covered with metallic films 22, respectively. Between these films, a magnetic gap 20 consisting of a glass 24 is formed. Incidentally, 26 is an insulating protective tube.

As shown in FIG. 3, a conventional core chip in which a wire is used, the coil has a large diameter. Accordingly, the window 12 for a coil could not be made smaller, and inductance could not be reduced.

Conventionally, an alloy of copper and silver has been used as a material for the wire having a minimum diameter of 22 $\mu$m and a maximum tensile strength of 20 g.

It is technically possible to thin down a copper alloy wire conventionally used. However, indeed, a wiring operation is manual, and therefore, a wire having a low tensile strength has problems of the snapping of the wire, and the like. Accordingly, the wire is required to have a tensile strength of at least 20 g. Therefore, it is difficult to use a thin copper alloy wire as a coil wire from the view point of mass-production.

Accordingly, it is difficult to achieve a memory density of 600 Mb/in$^2$ or more by using a magnetic head using a wire such as a conventional copper alloy wire.

As a structure of a composite type magnetic head, a core chip embedding type is known.

For producing this magnetic head, a track machining is first given, a core chip having a thickness (d) of 50 $\mu$m is inserted into a groove for inserting a core chip and tentatively fixed. Then, glass is fused and poured in the periphery of the track portion so as to fix the core chip to the slider. After that a tentative fixing member in a back portion is removed, and a resin is poured into the portion to fix the core chip to the slider. Then, surplus glass on a sliding surface is removed, and simultaneously, the surface is polished so as to form a gap depth.

A composite type magnetic head thus produced has a structure shown in, for example, FIG. 4.

In FIG. 4, 30 is a non-magnetic housing. In a condition that a core chip 29 is fixed to the housing 30, a coil 31 is set so as to form a slider 36. To the slider 36 having a coil 31 is connected a suspension 32 for generating a force toward a medium. To the suspension is fixed a tube 33 for insulating and protecting a lead wire 35. In this condition, a magnetic head 37 is constituted.

The magnetic head 37 floats at a minute intervals on the medium by a balance of a floating force and a pressure 4 from the slider 36 to the medium by the suspension 32. The floating force is generated between a sliding surface and the medium. Thus, the magnetic head 37 can move over the medium of the slider 36 at a high speed.

The smaller and lighter slider 36 is more preferable because a flowability is enhanced against a rough surface of the medium, the floating is more stable, a magnetic converting property is enhanced, and a speed-up of the movement of the slider 36 over the medium can be achieved. However, a size of the slider 36 is restricted by a size of a slit 34. As seen from FIG. 4, since a wire is wound in a state that the slider 36 slides, the slider 36 is provided with a slit 34 for the winding. A size of the slit 34 is restricted by a size of a slider 36. A size of the slit 34 is a maximum restrictive matter in the case that a size of the slider 36 is decreased. Accordingly, making a wire material for a coil thinner and making the coil smaller enables to miniaturization of the slider 36, thereby improving a floating stability.

Thus, it is important to thin down a wire material for a coil in a composite type magnetic head, too.

SUMMARY OF THE INVENTION

The present invention aims to provide a wire material of a composite metallic wire the diameter of which is reduced and the tensile strength of which is enlarged so as to enable a wiring operation.

The present invention aims to provide also a composite type magnetic head which can cope with a memory density of 600 Mb/in$^2$ or more by using the aforementioned composite wire.

The present invention is intended to solve the above problems.

According to the present invention, there is provided a composite metallic wire comprising:

an inner layer having a cross-sectional shape of a rough circle; and a metal outer layer having a cross-sectional shape of a rough ring;

wherein the composite metallic wire has a diameter of 15 μm or less and an electric resistance of 300 Ω/m or less.

The composite metallic wire is preferably provided with an insulating coat in the outer periphery of the outer layer.

The composite metallic wire preferably has a diameter of 14 μm or less.

The inner layer is preferably constituted of a wire material having a diameter of 12 μm or less and a tensile strength of 15 g or more.

Further, the inner layer may be composed of a metallic material, a carbonaceous material, or an organic material.

Furthermore, the outer layer is preferably constituted of a material having a specific resistance of $6 \times 10^{-8}$ Ω·m or less.

Furthermore, the composite metallic wire preferably has a tensile strength of 20 g or more.

According to the present invention, there is also provided a composite type magnetic head using as a coil wire a composite wire comprising:

a composite metallic wire comprising: an inner layer having a cross-sectional shape of a rough circle; and a metal outer layer having a cross-sectional shape of a rough ring; wherein the composite metallic wire has a diameter of 15 μm or less and an electric resistance of 300 Ω/m or less, and an insulating coat provided in the outer periphery of the outer layer.

Here, a memory density means a product of a track density and a wire recording density.

DETAILED DESCRIPTION OF THE PREFERRED EMBODIMENT

Figure 1:
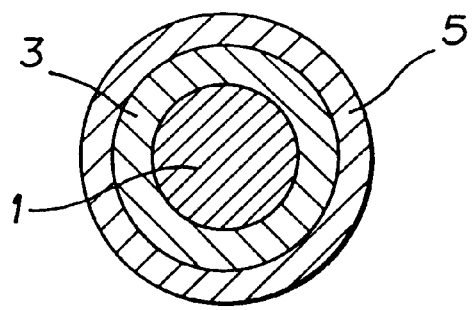
FIG. 1 is a cross-sectional view of a composite metallic wire showing an embodiment of the present invention.

As shown in FIG. 1, a composite metallic wire of the present invention is constituted of an inner layer 1 having a cross-sectional shape of a rough circle and a metallic outer layer 3 having a cross-sectional shape of a rough ring.

The inner layer 1 is preferably a wire having a diameter of 12 μm or less and a tensile strength of 15 g or more. As a material for the inner layer 1, there can be used a metal such as tungsten, molybdenum, beryllium copper, brass, platinum, or the like, which can be thinned down. Among them tungsten is most preferable in view of strength.

A material for the inner layer 1 may be a carbonaceous fiber, a SiC fiber, or an organic fiber, which can be thinned down. As a material of the organic fiber, there may be used phenolic resins a polyamide synthetic fiber such as, nylon 6, nylon 66, and KEVLAR® (an aramid fiber); a polyester synthetic fiber such as poly(ethylene terephthalate); and a vinyl chloride.

When a metallic fiber having a difficulty in plastic working such as tungsten, molybdenum, and the like, has a larger diameter than a predetermined one, it is subjected to electrolytic polishing, or the like, so as to obtain a predetermined diameter.

A material for the outer layer 3 may be a metal having a specific resistance of $6 \times 10^{-8}$ Ω·m or less, such as Ag, Cu, Au, and the like.

The outer layer 3 is formed by an electrolytic plating when the inner layer 1 is conductive, and by a nonelectrolytic plating when the inner layer 1 is not conductive. A thickness of the outer layer 3 is determined so that the outer layer 3 has an electric resistance of 300 Ω/m or less. Alternatively, a method such as vapor deposition, sputtering, or the like, may be used. The outer layer 3 is generally formed under the known normal conditions.

As an insulating coat 5, a natural used in the present invention is not particularly limited as it is long as a material having an insulating ability. For example, a material for insulating a coating of a magnet wire is applicable. As such a material, polyurethane, polyester, polyesterimide, or the like, can be employed. Among them polyurethane is suitable which can be soldered without removing the insulating coat. When one of the aforementioned insulating coats covering the composite metallic wire sustains damage upon winding operation surface of an insulating coat is preferably coated with a lubricating resin such as nylon, thereby enabling to avoid a damage.

Figure 2:
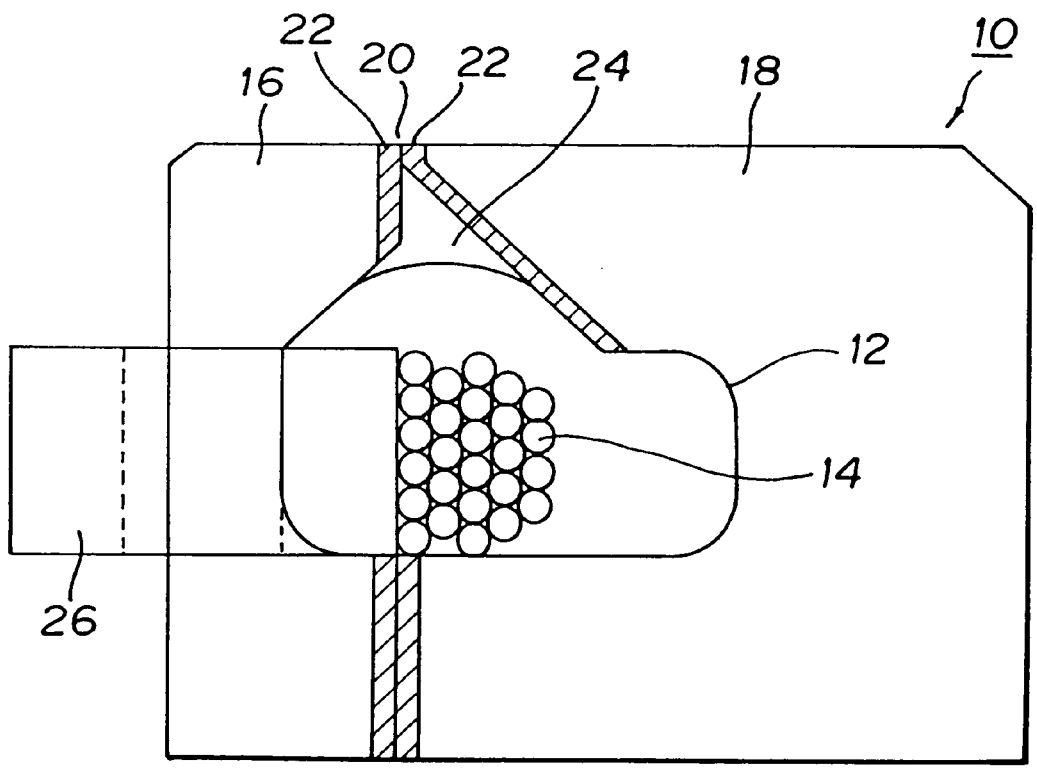
FIG. 2 is a front view of a core chip using a composite metallic wire of the present invention.

FIG. 2 shows a core chip in which a coil wire of the present invention is used. The constitution is the same as that of FIG. 3. A core chip 10 is constituted mainly of a trailing core 16 and a leading core 18. The trailing core 16 and the leading core 18 form a window 12 for winding a wire, around which a coil 14 of a wire is wound with a predetermined number of turns.

Figure 3:
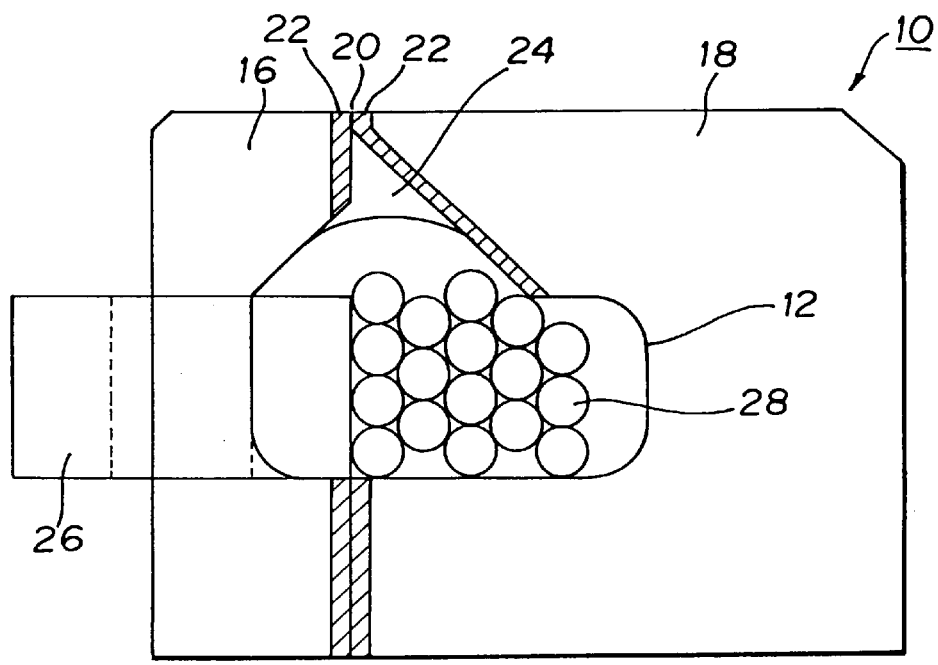
FIG. 3 is a front view of a core chip using a conventional coil.

As obvious from a comparison of structures in FIGS. 2 and 3, a core chip of the present invention using a coil wire having a smaller diameter has a coil 14 having a larger number of turns of wire around the window 12 in comparison with a conventional core chip having the same size of the window 12.

Figure 4:
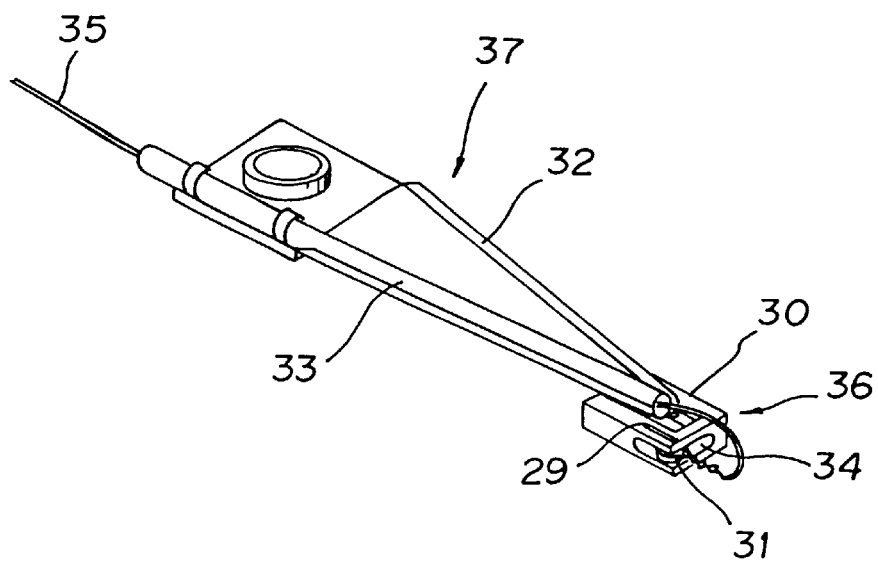
FIG. 4 is a front view of a magnetic head.

A composite type magnetic head of the invention can be produced by using the composite metallic wire of the present invention so as to have a structure like the one shown in FIG. 4.

That is, a core wire having a small diameter of the present invention is wound with the same number of turns as in a conventional core head, a core chip 29 and a slit 34 can be made smaller than those of the conventional core head, thereby enabling to miniaturize a slider 36.

As described above, according to a composite type magnetic head using a composite metallic wire of the present invention having a small diameter and a tensile strength of predetermined value or higher, miniaturization and lowering of an inductance can be achieved.

EXAMPLE

Examples 1–11

A tungsten wire (inner layer) having a diameter of 15 μm and a length of 1000 m was subjected to electrolytic polishing by a well-known method or a drawing so as to obtain a wire having a diameter of 8–12 μm.

Subsequently, on the obtained wire was formed an outer layer by a electrolytic plating in a well-known method using a copper having a thickness of 1.5–3.5 μm.

Then, an insulating coat made of polyurethane was formed on the outer layer so as to have a thickness of 2.5, 3.0 or 3.5 μm so as to obtain a composite metallic wire having the insulating coat and having a diameter of 19 or 22 μm.

The results are shown in Table 1.

For example, in the case of Example 1, a tungsten wire was subjected to electrolytic polishing to obtain a diameter of 8 μm. Subsequently, the outer layer made of copper having a thickness of 2.5 μm was formed. Then, an insulating coat made of urethane and having a thickness of 3.0 μm was formed on the outer surface so that a composite metallic wire having the insulating coat might have a diameter of 19 μm.

The composite metallic wire having the insulating coat had a tensile strength of 20 g and an electric resistance of 190 Ω/m.

TABLE 1

|  | Diameter of inner layer (μm) | Thickness of outer layer (μm) | Diameter of Composite Wire (μm) | Thickness of insulating coat (μm) | Diameter of Composite Wire w/insulating coat (μm) | Electric Resistance (Ω/m) | Tensile Strength (g) |
|---|---|---|---|---|---|---|---|
| Example 1 | 8 | 2.5 | 13 | 3.0 | 19 | 190 | 20 |
| Example 2 | 9 | 2.0 | | | | 260 | 23 |
| Example 3 | 8 | 3.0 | 14 | 2.5 | | 150 | 22 |
| Example 4 | 9 | 2.5 | | | | 180 | 25 |
| Example 5 | 10 | 2.0 | | | | 230 | 30 |
| Example 6 | 11 | 1.5 | | | | 290 | 32 |
| Example 7 | 8 | 3.5 | 15 | 3.5 | 22 | 130 | 23 |
| Example 8 | 9 | 3.0 | | | | 155 | 27 |
| Example 9 | 10 | 2.5 | | | | 170 | 33 |
| Example 10 | 11 | 2.0 | | | | 210 | 35 |
| Example 11 | 12 | 1.5 | | | | 260 | 40 |

Comparative Example 1

A tungsten wire (inner layer) having a diameter of 15 μm, and a length of 1000 m was subjected to a drawing so as to obtain a tungsten wire having a diameter of 10 μm.

Subsequently, an outer layer made of copper and having a thickness of 1.5 μm was formed on the wire by an electrolytic plating.

Then, an insulating coat made of polyurethane and having a thickness of 3.0 μm was formed to obtain a composite metallic wire having the insulating coat. The composite metallic wire having the insulating coat had a diameter of 19 μm. The other conditions were the same as in Example 1.

The results are shown in Table 2.

The composite metallic wire having the insulating coat had a tensile strength of 25 g and an electric resistance of 330 Ω/m.

Comparative Example 2

A tungsten wire (inner layer) was subjected to electrolytic polishing so as to obtain a tungsten wire having a diameter of 13 μm.

Subsequently, an outer layer made of copper and having a thickness of 1.0 μm was formed on the wire by an electrolytic plating.

Then, an insulating coat made of urethane and having a thickness of 3.0 μm was formed on the outer layer so as to obtain a composite metallic wire having the insulating coat and having a diameter of 21 μm. The other conditions were the same as in Example 1.

The results are shown in Table 2.

From Tables 1 and 2, the followings are understandable.
(1) From the comparison of Comparative Example 1 to Example 6, it is known that an electric resistance of 300 Ω/m or less cannot be obtained when a cross-sectional area of an outer layer is small even if the outer layer has the same thickness.
(2) When a thickness of an outer layer is increased and an inner layer is decreased so as to reduce the electric resistance, a tensile strength of the composite metallic wire is reduced.
(3) When tungsten wire is used for an inner layer, a lower limit of the diameter is 8 μm so as to satisfy a tensile strength of 20 g or more and an electric resistance of 300 Ω/m or less.

Reference Examples 1–7

Incidentally, a tungsten subjected to only electrolytic polishing was measured for an electric resistance. The results are shown in Table 3.

As shown in Table 3, an electric resistance of 300 Ω/m or less cannot be obtained by using only an electrolytically polished tungsten.

TABLE 3

|  | Diameter of inner layer (μm) | Thickness of outer layer (μm) | Thickness of insulating coat (μm) | Electric resistance (Ω/m) | Tensile strength (g) |
|---|---|---|---|---|---|
| Reference Example 1 | 8 | — | — | 1096 | 25 |
| Reference Example 2 | 9 | — | — | 865 | 32 |
| Reference Example 3 | 10 | — | — | 700 | 39 |
| Reference | 11 | — | — | 580 | 45 |

TABLE 2

|  | Diameter of inner layer (μm) | Thickness of outer layer (μm) | Diameter of Composite Wire (μm) | Thickness of insulating coat (μm) | Diameter of Composite Wire w/insulating coat (μm) | Electric Resistance (Ω/m) | Tensile Strength (g) |
|---|---|---|---|---|---|---|---|
| Comparative Example 1 | 10 | 1.5 | 13 | 3.0 | 19 | 330 | 25 |
| Comparative Example 2 | 13 | 1.0 | 15 | 3.0 | 21 | 360 | 50 |

TABLE 3-continued

| | Diameter of inner layer (μm) | Thickness of outer layer (μm) | Thickness of insulating coat (μm) | Electric resistance (Ω/m) | Tensile strength (g) |
|---|---|---|---|---|---|
| Example 4 Reference Example 5 | 12 | — | — | 487 | 56 |
| Reference Example 6 | 13 | — | — | 414 | 66 |
| Reference Example 7 | 14 | — | — | 357 | 76 |

Reference Examples 8–12

As a withstand voltage property in a case that a wire is wound around a core chip having a thickness of 35 μm, there were obtained thicknesses of insulating coats each satisfies a condition of over 25 MΩ at 50 V, over 1000 MΩ at 100 V, and over 1000 MΩ at 200 V.

The results are shown in Table 4.

As obvious from Table 4, it is necessary for an insulating coat to have a thickness of 2.5 μm or more. In this case, a composite metallic wire same as in Example 7 was used, and polyurethane was used as an insulating coat.

TABLE 4

| | Diameter of inner layer (μm) | Thickness of outer layer (μm) | Diameter of composite wire (μm) | Thickness of insulating coat (μm) | Diameter of composite wire w/ insulating coat (Ω/m) | Ratio of passing voltage withstand test of wire (%) |
|---|---|---|---|---|---|---|
| Reference Example 8 | | | | 1.0 | 17 | 30 |
| Reference Example 9 | | | | 2.0 | 19 | 75 |
| Reference Example 10 | 8 | 3.5 | 15 | 2.5 | 20 | 100 |
| Reference Example 11 | | | | 3.0 | 21 | 100 |
| Reference Example 12 | | | | 3.5 | 22 | 100 |

Example 12

A composite type magnetic head was produced by using a composite metallic wire of Example 1.

As a magnetic core, Mn—Zn ferrite which was grown by a solid phase reaction method was used. Metallic films between gaps are formed by Fe—Ta—N films each having a thickness of 2 μm or 5 μm. A composite metallic wire produced in Example 1 was used as a coil for a magnetic head. FIG. 2 shows a core for a 50% slider having 700 Mb/in$^2$. The composite metallic wire was wound 26 times to the core having a thickness of 35 μm and a window having a size of 0.10 mm×0.20 mm without breaking of the wire.

The obtained composite type magnetic head has an inductance of 0.6 μH. When a conventional cupper alloy wire, i.e., a wire having a diameter of 22 μm was used, the wire could be wound only 17 times, and a predetermined number of winding could not be obtained.

As described above, according to the present invention, there was obtained a composite metallic wire having a diameter of 15 μm or less and a tensile strength of 20 g or more for a wiring operation. Accordingly, a window for winding a wire can be miniaturized, and therefore, a magnetic head having a high memory density can be obtained.

Further, according to the present invention, there was obtained a magnetic head having a low inductance.

What is claimed is:

1. A composite type magnetic head having a coil wire, said coil wire comprising a composite metallic wire which comprises:

a core having a cross-sectional shape of a rough circle and being a member selected from the group consisting of a metallic fiber, a carbonaceous fiber, an SiC fiber and an organic fiber; and a metal outer layer having a cross-section shape of a rough ring; wherein the composite metallic wire has a diameter of 15 μm or less and an electrical resistance of 300 Ω/m or less, an insulating coat provided on the outer periphery of the outer layer.

2. A composite type magnetic head according to claim 1, wherein the core has a diameter of 12 μm or less and a tensile strength of 15 g or more.

3. A composite type magnetic head according to claim 1, wherein the outer layer is constituted of a material having a specific resistance of 6×10$^{-8}$ Ω·m or less.

4. A composite type magnetic head according to claim 1, wherein the composite metallic wire has a tensile strength of 20 g or more.

5. A composite type magnetic head according to claim 1, wherein said core is a member selected from the group consisting of tungsten, molybdenum, beryllium copper, brass, platinum, phenolic resins, nylon 6, nylon 66, aramid, poly(ethylene terephthalate) and vinyl chloride.

* * * * *